United States Patent [19]

Price

[11] 4,004,046
[45] Jan. 18, 1977

[54] METHOD OF FABRICATING THIN MONOCRYSTALLINE SEMICONDUCTIVE LAYER ON AN INSULATING SUBSTRATE

[75] Inventor: James B. Price, Phoenix, Ariz.
[73] Assignee: Motorola, Inc., Chicago, Ill.
[22] Filed: Feb. 27, 1975
[21] Appl. No.: 553,769

Related U.S. Application Data

[63] Continuation of Ser. No. 239,607, March 30, 1972, abandoned.
[52] U.S. Cl. .................... 427/85; 29/580; 148/175; 148/187; 156/626; 156/657
[51] Int. Cl.² ............. B44D 1/18; H01L 7/50
[58] Field of Search .......... 156/3, 8, 11, 17; 148/171, 175, 186, 187; 29/580, 583; 357/55; 427/85, 93, 95; 428/335, 428

[56] References Cited
UNITED STATES PATENTS

| | | | |
|---|---|---|---|
| 3,171,762 | 3/1965 | Rutz | 148/175 |
| 3,312,879 | 4/1967 | Godejahn | 156/17 X |
| 3,422,321 | 1/1969 | Tombs | 29/571 X |
| 3,509,433 | 4/1970 | Schroeder | 29/580 X |
| 3,523,842 | 8/1970 | Glendinning | 156/17 |

*Primary Examiner*—William A. Powell
*Attorney, Agent, or Firm*—Lowell E. Clark

[57] ABSTRACT

An extremely thin monocrystalline semiconductive layer over an electrical insulator is disclosed, as well as its method of fabrication. The semiconductive layer is of high quality to provide an electrically uniform substrate for fabrication of semiconductive devices. The electrical insulator is also thin, providing a short path for thermal conduction from the semiconductive device. The method of fabricating the structure lends itself to inclusion of a buried layer, either by diffusion or by performing an epitaxial growth at a particular point in the process. The process also lends itself to an optional growth of an epitaxial layer on the semiconductive layer. The insulator may be made of an oxide of the semiconductive layer material, or it may be made of silicon nitride or silicon oxynitride.

7 Claims, 8 Drawing Figures

METHOD OF FABRICATING THIN MONOCRYSTALLINE SEMICONDUCTIVE LAYER ON AN INSULATING SUBSTRATE

This is a continuation, of application Ser. No. 239,607, filed Mar. 30, 1972, now abandoned.

BACKGROUND OF THE INVENTION

1. Field of the Invention

This invention relates to extremely small and extremely high speed semiconductive devices. It also pertains to semiconductive devices having unusual heat transfer requirements.

2. Description of the Prior Art

A thin layer of monocrystalline semiconductive material over an insulating substrate has been actively investigated because of the high speed and small size qualities desired in semiconductors. Silicon semiconductive material on sapphire is a composite device that has been investigated and used. However, forming a silicon monocrystalline layer over the sapphire invariably results in a somewhat structurally defective monocrystalline layer. Silicon has also been formed over spinel; this combination has the same problems as silicon on sapphire.

BRIEF SUMMARY OF THE INVENTION

In the preferred embodiment, a monocrystalline silicon wafer cut along the 100 crystallographic plane is employed as the basic structure. It is polished on its top surface and on its bottom surface and a silicon dioxide layer is formed by a thermal oxidizing process. The oxide layer could, of course, be formed by other well known means. A channel is etched from the bottom surface toward the top surface using KOH as the etchant. The etching is stopped when a particular thickness of the wafer remains as determined by the amount of light passing through it. The insulator is then formed over the walls and floor of the channel. The insulator is typically formed of silicon dioxide by a thermal oxidation process. However, the insulator may well be formed of a silicon nitride or a silicon oxynitride.

To give the structure strength, the supporting member is then deposited over the insulator. The supporting member is typically comprised of a polycrystalline silicon. The structure is then, in essence, turned over and the silicon oxide originally deposited is stripped from the top side, exposing the remaining thickness of the silicon monocrystalline semiconductive layer.

After the channel has been etched, a buried layer of a desired conductivity tape can be fabricated either by diffusion or by epitaxial growth. Also, after the silicon dioxide has been stripped from the top surface, an epitaxial growth can be made.

DETAILED DESCRIPTION OF THE INVENTION

Figure 1:
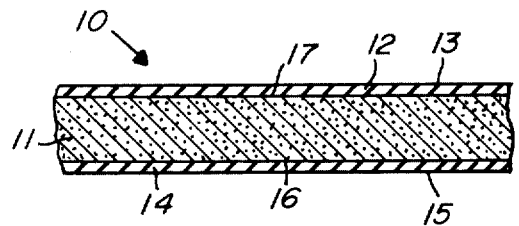
FIGS. 1 and 2 illustrate the first two steps in the manufacturing process of this invention.

Referring first to FIG. 1, a monocrystalline silicon substrate wafer 11 is shown. Typically, this wafer has been planarized top and bottom by polishing, with a taper of less than 0.1 mil and a thickness of approximately 10 mils. The structure 10 is shown with a layer of silicon oxide 12 on the top surface 17 of substrate 11 and silicon oxide layer 14 on the bottom side 16 of substrate 11. The substrate is not restricted to silicon, as those skilled in the art know. It could be comprised of germanium, for example. Also, the insulating oxide layers 12 and 14 need not be oxides but could be nitrides or silicon oxynitride.

Figure 2:
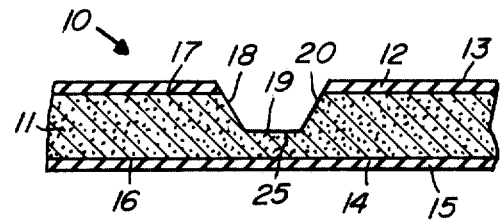

FIG. 2 illustrates the structure 10 after channel 20 has been etched. A typical etchant used with the silicon is potassium hydroxide (KOH). For purposes which will be explained below, the monocrystalline silicon substrate 11 was cut on the 100 crystallographic plane. The etching step typically includes developing a pattern using a well known photographic technique. Hydrofluoric acid is used to attack the unprotected areas of the pattern, removing the silicon dioxide. The surface is then cleaned and finally etched with KOH which etches the unprotected silicon at a rate approximately 300 times as fast as the silicon dioxide.

The area 25 of FIG. 2 is retained in this process by terminating the etching when the desired dimension is reached. This dimension can be measured by shining light at surface 15 of the silicon dioxide layer 14 and monitoring the amount of light passing through the structure at floor 19 of the channel 20. When the intensity of light reaches a particular value, the etching is stopped thereby retaining area 25.

Another method of measurement is to measure the depth of channel 20. The substrate 11 is cut on a 100 crystallographic plane. The KOH etchant etches walls 18 of channel 20 at a known angle with the vertical. Thus a measurement of the top of channel 20 and a measurement of the floor 19 of channel 20 provides one side of a right triangle which includes the known angle. The depth of the channel 20 is easily calculated. The thickness of area 25 can be determined as simply the difference between the total thickness and the depth of channel 20.

Figure 3:
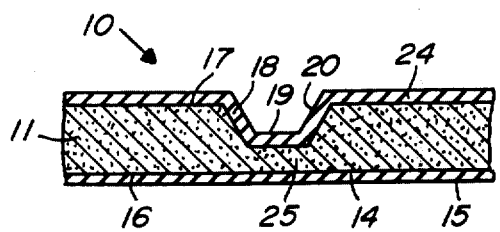
FIGS. 3–5 illustrate subsequent steps in the fabrication of the device of this invention.

Referring now to FIG. 3, a silicon dioxide layer 24 is shown attached to the upper surface 17 of substrate 11 and to the walls 18 and floor 19 of the channel 20. The silicon dioxide layer 24 can be deposited on the substrate 11 or it can be thermally grown. As mentioned earlier, a silicon nitride insulator 24 is excellent for the application as is silicon oxynitride.

Prior to the forming of support 24, the remaining first silicon dioxide layer 12 is customarily stripped from the substrate 11.

Figure 4:
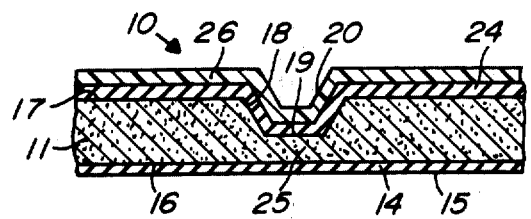

FIG. 4 illustrates the structure after the application of a supporting member 26 comprised of polycrystalline silicon. The member 26 is deposited to give the structure physical strength.

Figure 2A:
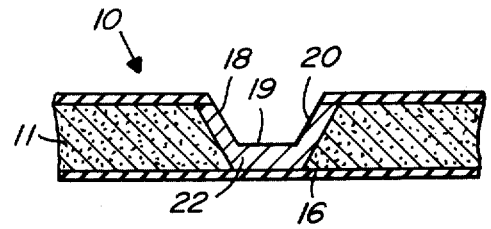
FIGS. 2A and 2B each illustrate optional steps of providing a buried layer.
Figure 5:
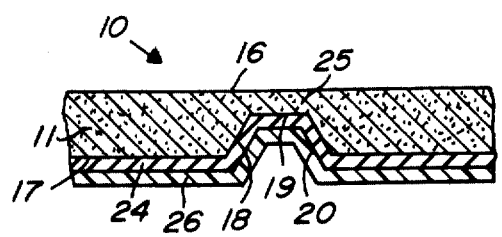
Figure 5A:
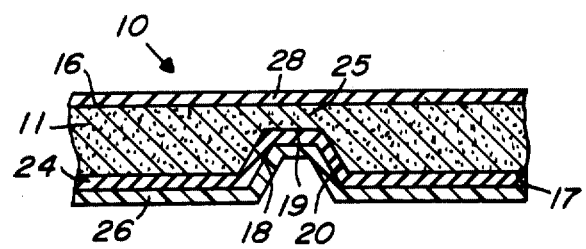
FIG. 5A illustrates an optional step of fabrication after the basic fabrication steps have been completed.

FIG. 5 is turned upside down from FIG. 4 and shows the silicon dioxide layer 14 having been removed from top surface 16 of substrate 11. The area 25 is the situs of any device desired to be fabricated. For example, the optional silicon epitaxial layer 28 of FIG. 5A could be grown over surface 16 with diffusions made into it as well as into the localized area 25 to form any desired semiconductive device. Also, the use of the silicon epitaxial layer 28 could be very useful in conjunction with the option shown in FIG. 2A of diffusing a buried layer 22 into substrate 11. Such a diffusion results in a heavy concentration of impurities at the floor of channel 19 and a lesser concentration at surface 16 of substrate 11. The lesser concentration permits the growth of a high quality epitaxial layer 28. The epitaxial layer can be used for localized diffusions to form a transistor over the buried layer.

Figure 2B:
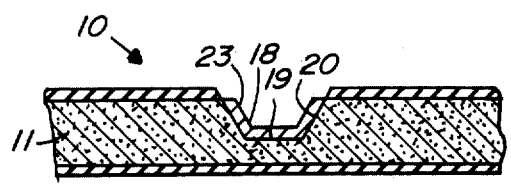

FIG. 2B illustrated another means of supplying a buried layer. An epitaxial layer 23 is grown on the walls 18 and floor 19 of channel 20. The epitaxial layer may contain a desired impurity to form a desired conductivity type material. It has application as a buried layer and the same fashion as described for the diffused region 22 of FIG. 2A.

The thickness of area 25 is in the order of 2 to 3 microns. The monocrystalline material is high quality and heretofore unobtainable at such a small dimension. Those skilled in the art appreciate that the structure and method of fabrication of this invention has many applications and is not limited to the preferred embodiment described herein.

I claim:

1. A method of forming a semiconductor substrate located over a dielectric layer for receiving semiconductor devices comprising the steps of:
   a. selecting a body of semiconductor material with substantially planar upper and under surfaces and having a predetermined thickness;
   b. removing selectively semiconductor material from the under surface of said body towards its upper surface a predetermined depth for forming a channel, said channel having a channel bottom surface portion substantially parallel to and a predetermined distance from said upper surface, the distance between said upper surface and said channel bottom surface portion defining the upper and lower semiconductor surfaces of the semiconductor substrate;
   c. depositing a dielectric material in said channel for selectively forming a dielectric layer for minimizing capacitance between said semiconductor material and said dielectric layer;
   d. depositing a layer of material over said dielectric layer for forming a base supporting member for said substrate; and
   e. forming directly into the upper surface above said channel of the semiconductor substrate at least one semiconductor junction device.

2. A method of forming a semiconductor substrate located over a dielectric layer for receiving semiconductor devices as in claim 1 wherein:
   a. said step of removing selectively semiconductor material from the under surface of said body in order to precisely define the dimension between the upper and lower surfaces of the semiconductor substrate includes the step of measuring the distance between the upper surface and said channel bottom surface portion.

3. A method of forming a semiconductor substrate located over a dielectric layer for receiving semiconductor devices as in claim 1 wherein:
   a. said removing step comprises the step of etching.

4. A method of forming a semiconductor substrate located over a dielectric layer for receiving semiconductor devices as in claim 1 wherein:
   a. said forming step further includes the step of depositing a top layer of semiconductor material over said upper surface of the semiconductor substrate.

5. A method of forming a semiconductor substrate located over a dielectric layer for receiving semiconductor devices as in claim 4 wherein:
   a. said dielectric material comprises silicon dioxide.

6. A method of forming a semiconductor substrate located over a dielectric layer for receiving semiconductor devices in claim 1 wherein:
   a. said step of removing selectively semiconductor material from the under surface of said body in order to precisely define the dimension between the upper and lower semiconductor surfaces of the semiconductor substrate includes the step of measuring the depth of said channel.

7. The method of claim 6 wherein the step of measuring the thickness further comprises:
   exposing the top surface to light; and
   monitoring the intensity of the light passing through the top surface into the channel.

* * * * *